(12) United States Patent
Cheng et al.

(10) Patent No.: US 9,685,434 B2
(45) Date of Patent: Jun. 20, 2017

(54) INTER-LEVEL DIELECTRIC LAYER IN REPLACEMENT METAL GATES AND RESISTOR FABRICATION

(71) Applicant: International Business Machines Corporation, Armonk, NY (US)

(72) Inventors: Kangguo Cheng, Schenectady, NY (US); Ali Khakifirooz, Los Altos, CA (US); Alexander Reznicek, Troy, NY (US); Charan V. V. S. Surisetty, Cliffton Park, NY (US)

(73) Assignee: International Business Machines Corporation, Armonk, NY (US)

(*) Notice: Subject to any disclaimer, the term of this patent is extended or adjusted under 35 U.S.C. 154(b) by 76 days.

(21) Appl. No.: 14/565,954

(22) Filed: Dec. 10, 2014

(65) Prior Publication Data

US 2016/0172356 A1 Jun. 16, 2016

(51) Int. Cl.
| | |
|---|---|
| H01L 27/06 | (2006.01) |
| H01L 29/66 | (2006.01) |
| H01L 21/8234 | (2006.01) |
| H01L 21/321 | (2006.01) |
| H01L 49/02 | (2006.01) |
| H01L 21/3105 | (2006.01) |

(52) U.S. Cl.
CPC .... *H01L 27/0629* (2013.01); *H01L 21/31055* (2013.01); *H01L 21/3212* (2013.01); *H01L 21/823437* (2013.01); *H01L 28/20* (2013.01); *H01L 29/66545* (2013.01)

(58) Field of Classification Search
CPC ......... H01L 27/0629; H01L 21/823437; H01L 21/3212; H01L 21/31055; H01L 29/66545; H01L 28/20
See application file for complete search history.

(56) References Cited

U.S. PATENT DOCUMENTS

| | | | |
|---|---|---|---|
| 6,465,312 B1 * | 10/2002 | Yu | ............ H01L 29/41775 257/E21.438 |
| 6,727,556 B2 | 4/2004 | Shiiki et al. | |
| 7,985,639 B2 | 7/2011 | Johnson et al. | |
| 8,058,125 B1 | 11/2011 | Lin et al. | |
| 8,603,915 B2 | 12/2013 | Alptekin et al. | |
| 8,796,772 B2 | 8/2014 | Yeh et al. | |
| 9,412,656 B2 * | 8/2016 | Fu | ............ H01L 21/76879 |
| 2011/0057267 A1 | 3/2011 | Chuang et al. | |
| 2011/0266637 A1 | 11/2011 | Lee et al. | |

(Continued)

*Primary Examiner* — Stephen W Smoot
*Assistant Examiner* — Sun M King
(74) *Attorney, Agent, or Firm* — Steven J. Meyers; Hoffman Warnick LLC

(57) ABSTRACT

Embodiments in accordance with the present invention include a method of fabricating a semiconductor device including forming a first dummy gate in an active area on a first portion of a semiconductor device, wherein the first dummy gate includes undoped amorphous silicon. A second dummy gate and a third dummy gate are formed on a second portion of the semiconductor device, wherein the second dummy gate and the third dummy gate include undoped amorphous silicon. A filling material is deposited on the semiconductor device, where the filling material is doped amorphous silicon, and a chemical-mechanical polishing process is performed on the filling material.

19 Claims, 8 Drawing Sheets

(56) References Cited

U.S. PATENT DOCUMENTS

| | | | |
|---|---|---|---|
| 2012/0135577 A1* | 5/2012 | Lee | H01L 21/76895 438/299 |
| 2013/0119480 A1 | 5/2013 | Wong et al. | |
| 2013/0240990 A1* | 9/2013 | Yin | H01L 29/456 257/343 |
| 2013/0260548 A1* | 10/2013 | Park | H01L 29/49 438/592 |
| 2014/0145246 A1 | 5/2014 | Ning et al. | |
| 2014/0175550 A1 | 6/2014 | Gauthier, Jr. et al. | |

* cited by examiner

INTER-LEVEL DIELECTRIC LAYER IN REPLACEMENT METAL GATES AND RESISTOR FABRICATION

BACKGROUND

The utilization of replacement metal gates is the typical approach for active device schemes, which typically involves a number of chemical-mechanical polishing (CMP) steps. Active devices can include multiple gate structures such as, FinFETs or planar MOSFETs. Typically, a high quality material is desired as the stop layer for the CMP process. Currently, oxide deposited by a combination of flowable chemical vapor deposition (FCVD) and high density plasma (HDP) can be utilized as dielectric material. FCVD oxide is typically a soft material, utilized for high aspect ratio gap fill. FCVD is not an optimal CMP stop layer due to flowable oxide being a soft material susceptible to dishing that can occur on the top surface. HDP oxide is susceptible to recess variations and is typically lost before the replacement high-k/metal gate processing.

SUMMARY

Embodiments in accordance with the present invention provide a method of fabricating a semiconductor device. In the method of fabrication, a first dummy gate is formed in an active area on a first portion of a semiconductor device, wherein the first dummy gate includes undoped amorphous silicon. A second dummy gate and a third dummy gate are formed on a second portion of the semiconductor device, wherein the second dummy gate and the third dummy gate include undoped amorphous silicon. A filling material is deposited on the semiconductor device, where the filling material is doped amorphous silicon, and a chemical-mechanical polishing process is performed on the filling material.

Embodiments in accordance with the present invention provide a semiconductor device. The semiconductor device includes an active area on a first portion of a semiconductor device, wherein the active area includes at least one active gate. The semiconductor device includes an insulator area on a second portion of a semiconductor device, wherein the insulator area includes at least a first dummy gate and a second dummy gate. The semiconductor device includes a resistor region formed between the first and second dummy gates, wherein the resistor region includes amorphous silicon.

DETAILED DESCRIPTION

Figure 1A:
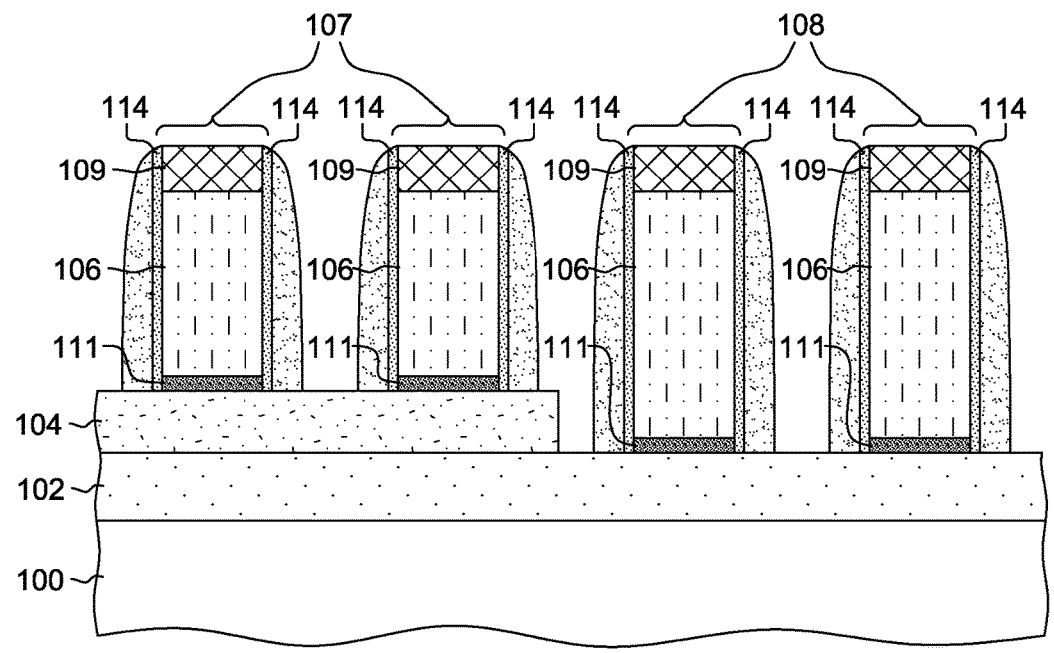
FIG. 1A depicts a cross-sectional view of a semiconductor with an active area with gates and an insulator area with gates on oxide, in an embodiment in accordance with the present invention.

Embodiments in accordance with the present invention allow for the formation of an active gate on an active area of a semiconductor device and the formation of multiple dummy gates on an insulator area of a semiconductor device, where regions between the dummy gates create resistors. The semiconductor device is fabricated by forming a first dummy gate in an active area on a first portion of a semiconductor device, where the first dummy gate includes undoped amorphous silicon. Embodiments in accordance with the present invention form a second dummy gate and a third dummy gate on a second portion of the semiconductor device, where the second dummy gate and the third dummy gate include undoped amorphous silicon. Subsequently, filling material is deposited on the semiconductor device, where the filling material is doped amorphous silicon. Selective etching between doped amorphous silicon and undoped amorphous silicon, allows for the formation of resistor regions between dummy gates in the insulator area of the semiconductor device.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

Referring now to the figures, FIG. 1A depicts a cross-sectional view of a semiconductor with an active area with gates and an insulator area with gates on insulator (e.g., oxide), in an illustrative embodiment in accordance with the present invention. In this embodiment, the active area and the insulator area with gates and gates on oxide are built on a silicon-on-insulator (SOI) substrate which includes semiconductor substrate 100 and buried oxide layer (BOX) 102. In another embodiment, not illustrated in FIG. 1A, a bulk substrate can be utilized. Semiconductor substrate 100 is a semiconductor material, preferably a silicon-containing material including, but not limited to, silicon, silicon germanium alloys, silicon carbon alloys, or silicon germanium carbon alloys. Other semiconductor substrates such as III-V, II-V compound semiconductor, or the combination of silicon-containing and compound semiconductor substrate are also conceived. BOX 102 can be silicon oxide ($SiO_2$) or any other suitable dielectric material that acts as an insulator on top of semiconductor substrate 100. BOX 102 can be formed by thermally oxidizing the exposed surface of semiconductor substrate 100, or may be deposited into semiconductor substrate 100 using, for example, chemical vapor deposition (CVD) or atomic layer deposition (ALD).

This embodiment includes semiconductor layer 104, wherein semiconductor layer 104 represents a thin layer of semiconductor (e.g., silicon, silicon germanium, III-V compound semiconductor, II-V compound semiconductor). The channel region under each gate 107 connects to the source and drain regions next to each gate 107. Source/drain region can be formed by epitaxy, ion implantation, solid phase doping, or any suitable combination of those techniques. Besides fins, the semiconductor layer 104 can also be planar semiconductor layers for forming planar devices. Gates 107 represent an active gate of a semiconductor device, where gate 107 is on top of a semiconductor layer. Gates on oxide 108 are on an insulator area. The insulator area can be a BOX layer in an SOI substrate or shallow trench isolation (STI) region. Each gate on oxide 108 represents a structure connected to the insulator region (e.g., BOX 102), without semiconductor layer 104 channeling through each gate on oxide 108. The two gates on oxide 108 will act as a base for a resistor while the two gates 107 will act as a base for a logic of the active semiconductor device. Each gate may include undoped amorphous silicon 106 and a dummy gate oxide 111. Each gate may further include a hardmask layer 109 which can be any suitable dielectric (e.g., silicon nitride). Each gate may further include spacers 114 on gate sidewalls.

Figure 1B:
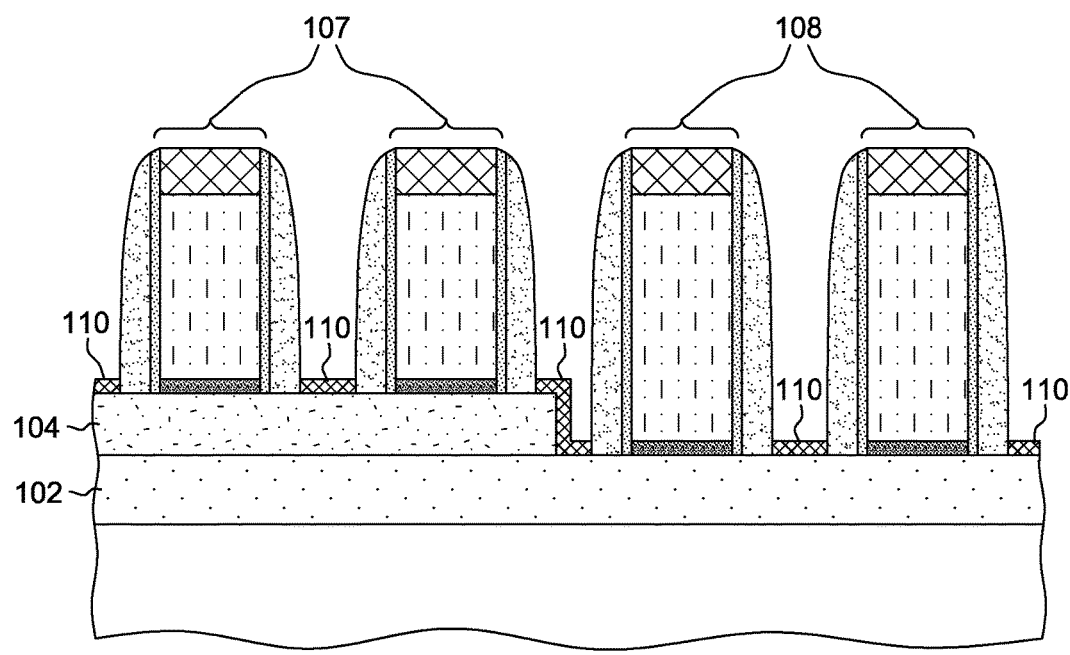
FIG. 1B depicts a cross-sectional view of a semiconductor with a liner, in an embodiment in accordance with the present invention.

FIG. 1B depicts a cross-sectional view of a semiconductor with an optional liner, in an illustrative embodiment in accordance with the present invention. Liner 110 represents a dielectric layer deposited using, for example, chemical vapor deposition (CVD), or atomic layer deposition (ALD). In this embodiment, liner 110 is silicon nitride and is deposited on top of the semiconductor device covering gates 107, gates on oxide 108, semiconductor layer 104, and BOX 102. Liner 110, if present, acts as a protection layer on the semiconductor layer 104 during the subsequent processes.

Figure 1C:
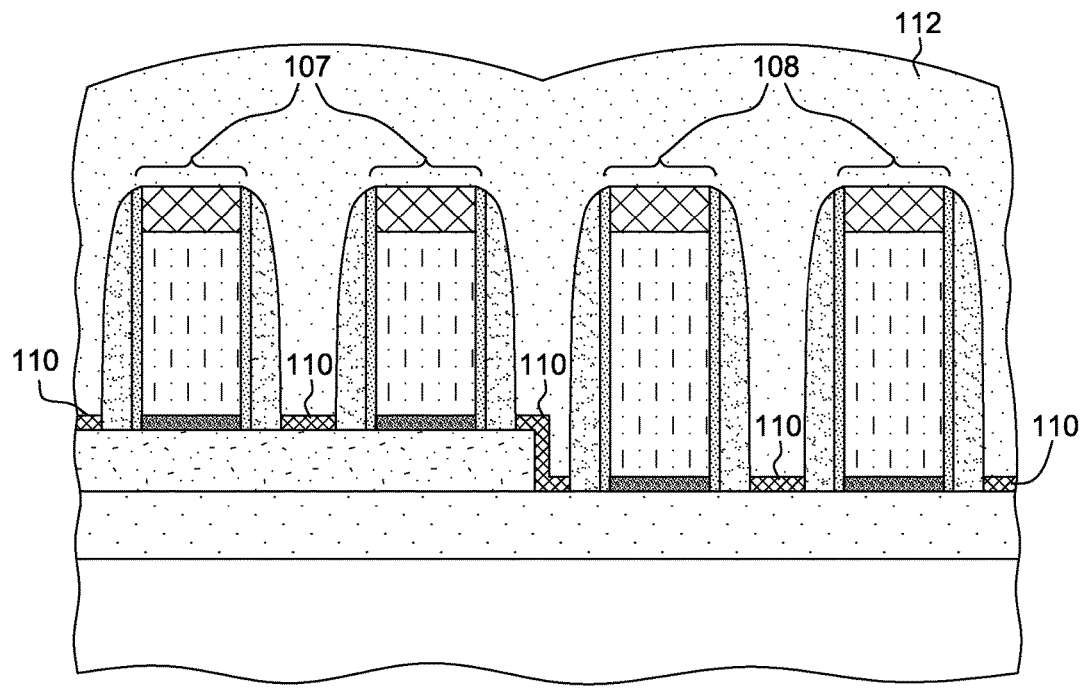
FIG. 1C depicts a cross-sectional view of a semiconductor with a deposit of filling material, in an embodiment in accordance with the present invention.

FIG. 1C depicts a cross-sectional view of a semiconductor with a deposit of filling material. In this embodiment, filling material 112 is boron doped amorphous silicon deposited on top of liner 110. Preferably, the boron concentration in the filling material 112 ranges from $1\times10^{19}$ per cubic centimeter to $1\times10^{21}$ per cubic centimeter, although concentration lower than $1\times10^{19}$ per cubic centimeter or higher than $1\times10^{21}$ per cubic centimeter are also contemplated. Due to filling material 112 being a doped amorphous silicon, filling material 112 can be selectively etched with regard to undoped amorphous silicon (i.e., dummy gate material) located in gates 107 and gates of oxide 108.

Figure 1D:
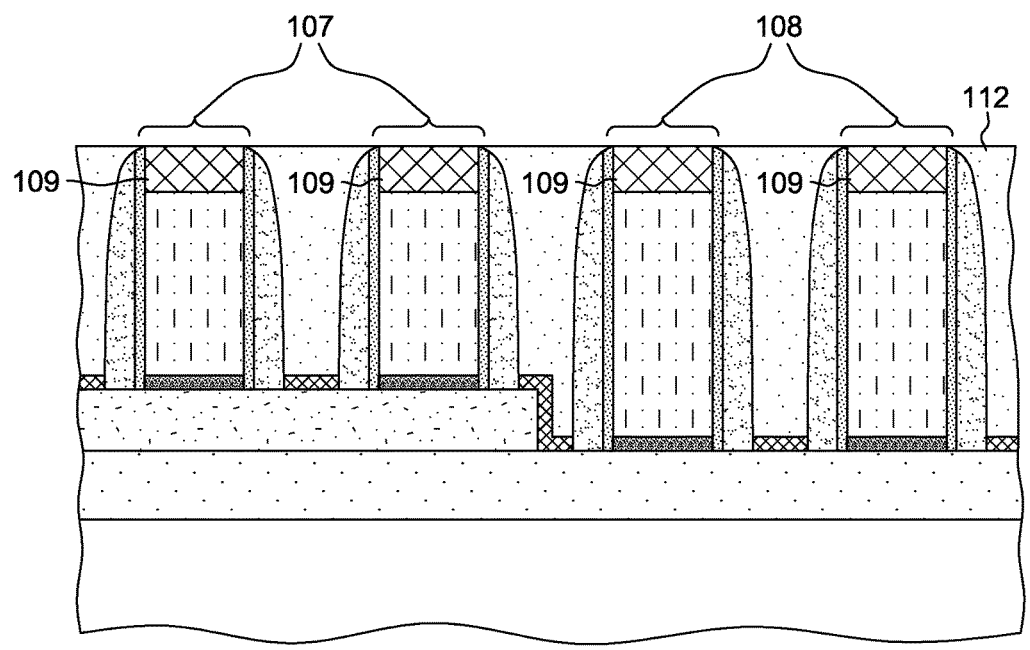
FIG. 1D depicts a cross-sectional view of a semiconductor with a filling material having gone through a chemical mechanical polishing process, in an embodiment in accordance with the present invention.

FIG. 1D depicts a cross-sectional view of a semiconductor with a filling material having gone through a chemical mechanical polishing process, in an embodiment in accordance with the present invention. Filling material 112 undergoes a chemical-mechanical polishing (CMP) process down to the top surface of the gates 107 and gates on oxide 108. The CMP process of filling material 112 stops once hardmask layer 109 (i.e., silicon nitride cap) of the gates 107 and gates on oxide 108 is reached.

Figure 2A:
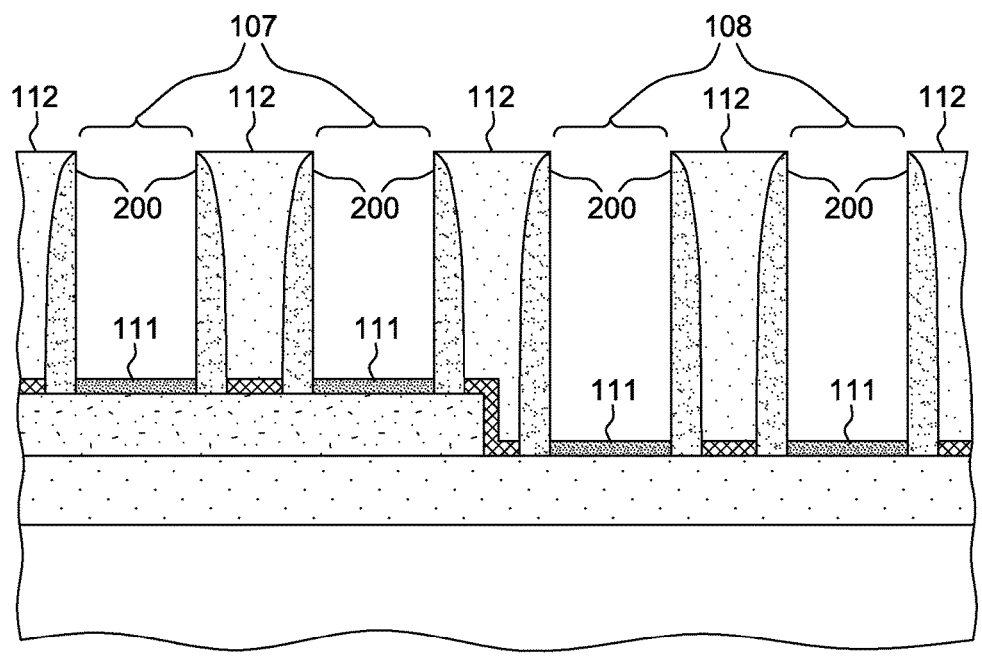
FIG. 2A depicts a cross-sectional view of a semiconductor with a removal of dummy gates, in an embodiment in accordance with the present invention.

FIG. 2A depicts a cross-sectional view of a semiconductor with a removal of dummy gates, in an illustrative embodiment in accordance with the present invention. Gate walls 200 of gates 107 and gates on oxide 108 represent the walls of the trench where undoped amorphous silicon 106 and hardmask 109 (i.e., SiN cap) was pulled out. The hardmask layer 109 can be removed through etching, preferably by dry etch (e.g., RIE), or wet etch (e.g., hot phosphoric acid). Undoped amorphous silicon 106 can be removed by dry etch (e.g., RIE) or wet etch (e.g., TMAH or ammonia etch) selective to filling material 112 (i.e., boron-doped amorphous silicon). Dummy gate oxide 111 remains in the trench between gate walls 200 until it is removed prior to the depositing of material into gates 107 and gates on oxide 108.

Figure 2B:
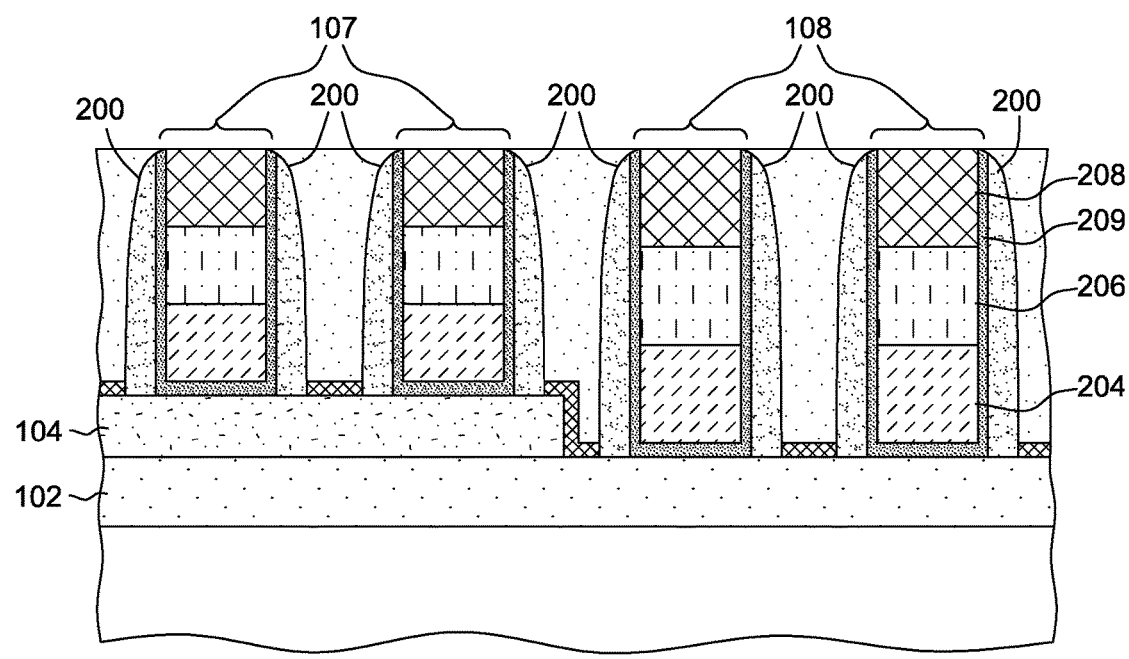
FIG. 2B depicts a cross-sectional view of a semiconductor with deposited material between gate walls, in an embodiment in accordance with the present invention.

FIG. 2B depicts a cross-sectional view of a semiconductor with deposited material between gate walls. Gate walls 200 act as bounds for material being deposited to form the gate structure of gates 107 and gates on oxide 108. Dummy gate oxide 111 is removed with the utilization of hydrofluoric acid or through chemical oxide removal. Gate dielectric 209 is deposited on the semiconductor device, where the gate dielectric 209 acts as a liner for the sidewalls and bottom of each trench of gates 107 and gates on oxide 108. Typically, gate dielectric 209 is a high-K dielectric (a dielectric material with a high dielectric constant K) that is a few nanometers in thickness.

In this embodiment, deposited material includes work-function metal (WFM) 204, fill metal 206, and self-aligned contact (SAC) cap 208. WFM 204 is deposited between gate walls 200, where WFM 204 recesses on top of gate dielectric 209 on gates 107 and gates on oxide 108. WFM 204 may be a material such as titanium nitride (TiN) or tantalum nitride (TaN) and it should be appreciated by one skilled in the art that the selection and use of WFM 204 is based on the desired electrical characteristics of the semiconductor device. Fill metal 206 is deposited between gate walls 200 and recesses on top of WFM 204 in gates 107 and gates on oxide 108. Fill metal 206 may be tungsten (W) or aluminum (Al). Excessive replacement gate materials (e.g., fill metal 206) may be removed from the surface, for example, through a CMP process. SAC cap 208 is deposited on top of fill metal 206, wherein SAC cap 208 may be a material such as silicon nitride (SiN). The top of SAC cap 208 can align with the top of filling material 112 on the outer side of gate walls 200.

Figure 2C:
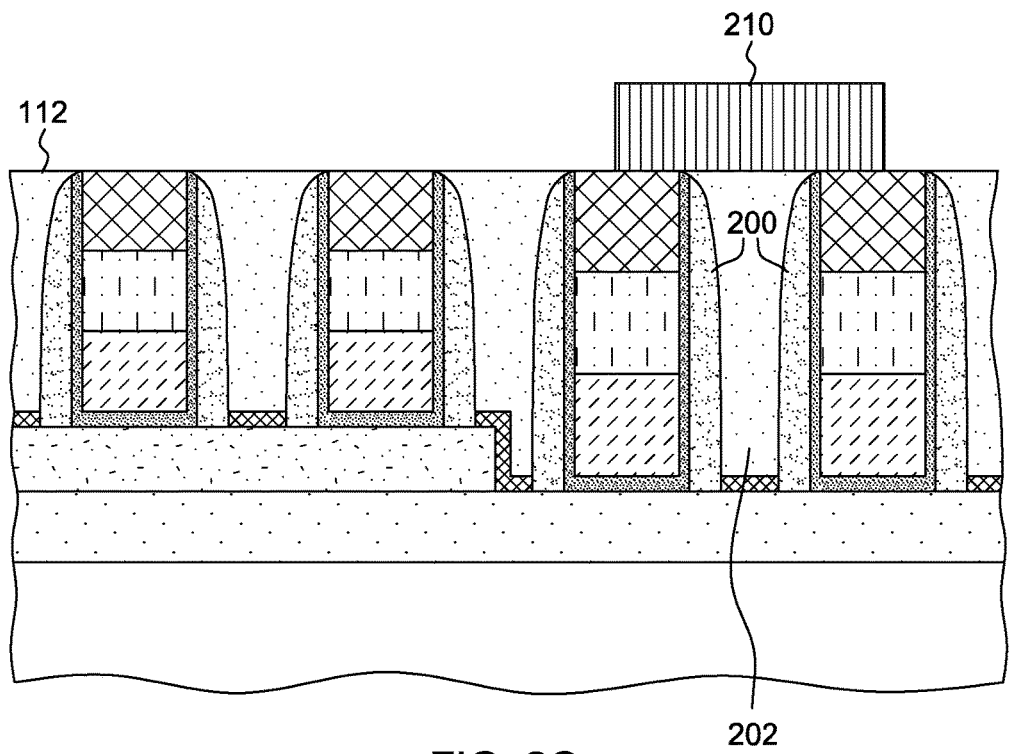
FIG. 2C depicts a cross-sectional view of a semiconductor with a mask for a resistor region, in an embodiment in accordance with the present invention.

FIG. 2C depicts a cross-sectional view of a semiconductor with a mask for a resistor region, in an embodiment in accordance with the present invention. Mask 210 is placed over a future resistor region 202, wherein the future resistor region 202 is located between the outer sides of gate walls 200 located between the two gates on oxide 108. Mask 210 covers the resistor region 202 (i.e., a-Si) such that mask 210 prevents the etching of the a-Si filling material 112 located below. Mask 210 can be a soft mask, for example, a photoresist formed by photolithography. Alternatively, mask 210 can be a hardmask, where a photoresist material is applied over the masking layer to effect patterning the hardmask layer.

Figure 2D:
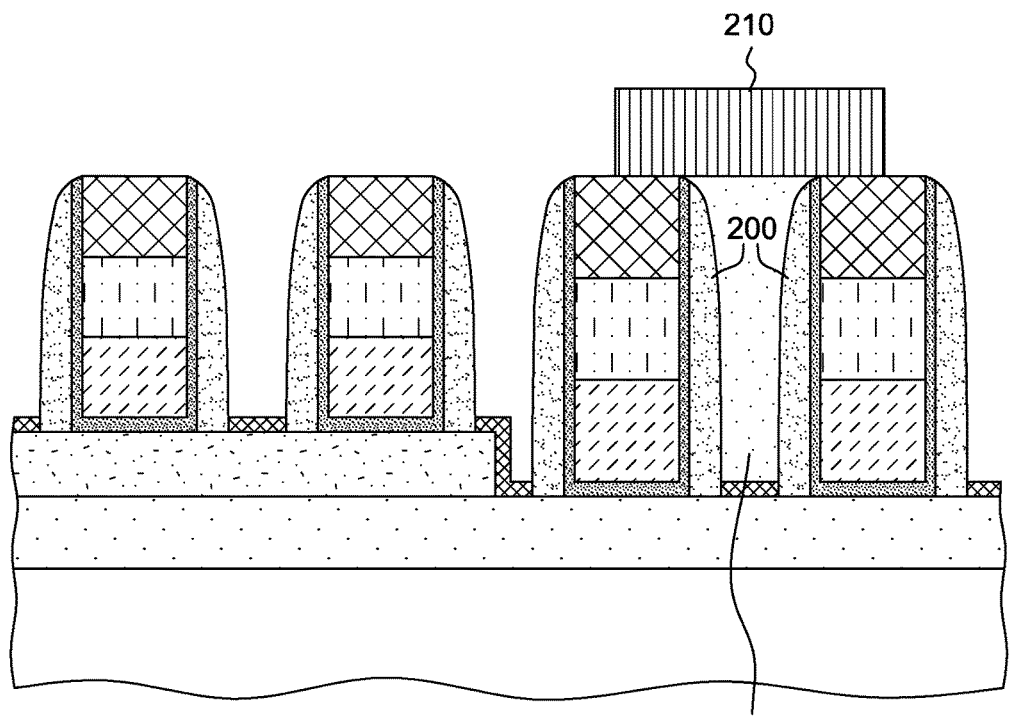
FIG. 2D depicts a cross-sectional view of a semiconductor with a removal of deposited filling material except in the resistor region, in an embodiment in accordance with the present invention.

FIG. 2D depicts a cross-sectional view of a semiconductor with a removal of deposited filling material except in the resistor region 202. Filling material 112 is selectively etched from the active areas of the semiconductor device between the outer sides of gate walls 200 not covered by mask 210. The selective etching can be done through hydrogen chloride (HCl) etching. The filling material 112 located between the outer sides of gate walls 200 between the two gates on oxide 108, form resistor region 202 of the semiconductor device.

Figure 3A:
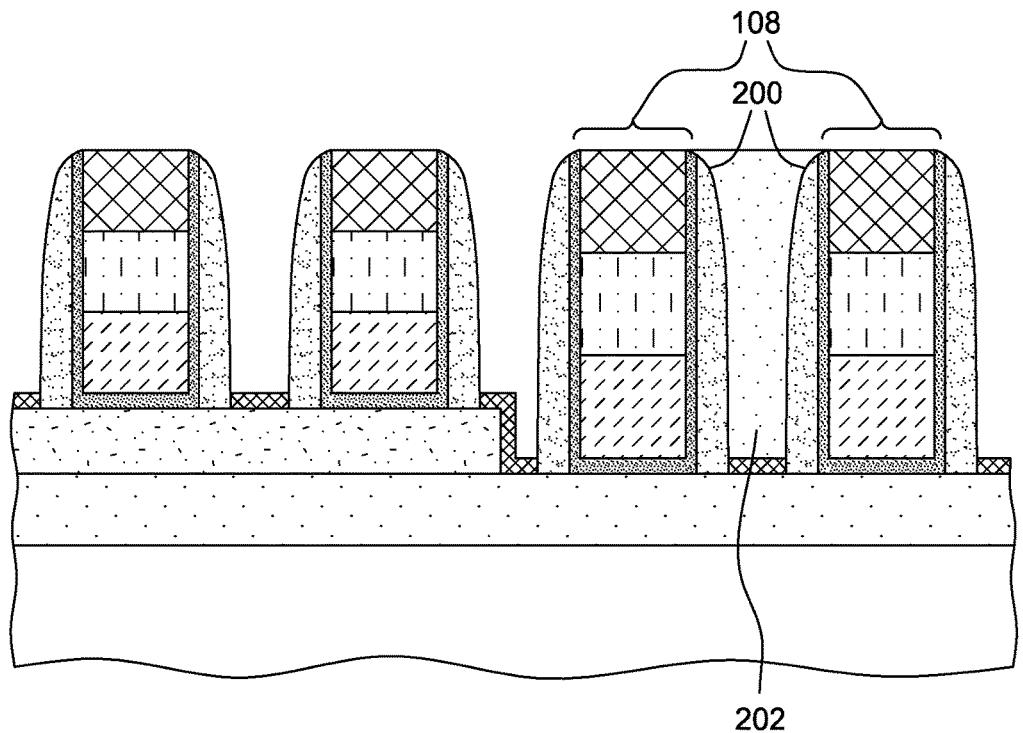
FIG. 3A depicts a cross-sectional view of a semiconductor with a removal of a mask for a resistor region, in an embodiment in accordance with the present invention.

FIG. 3A depicts a cross-sectional view of a semiconductor with a removal of a mask for a resistor region, in an illustrative embodiment in accordance with the present invention. Mask 210 is removed, revealing resistor region 202 between the outer sides of gate walls 200 of gates on oxide 108. Mask 210 can be removed using a dry strip (e.g., plasma etch) or a wet strip (e.g., sulfuric peroxide). The top of resistor region 202 aligns with the top of gates on oxide 108 (i.e., SAC cap 208).

Figure 3B:
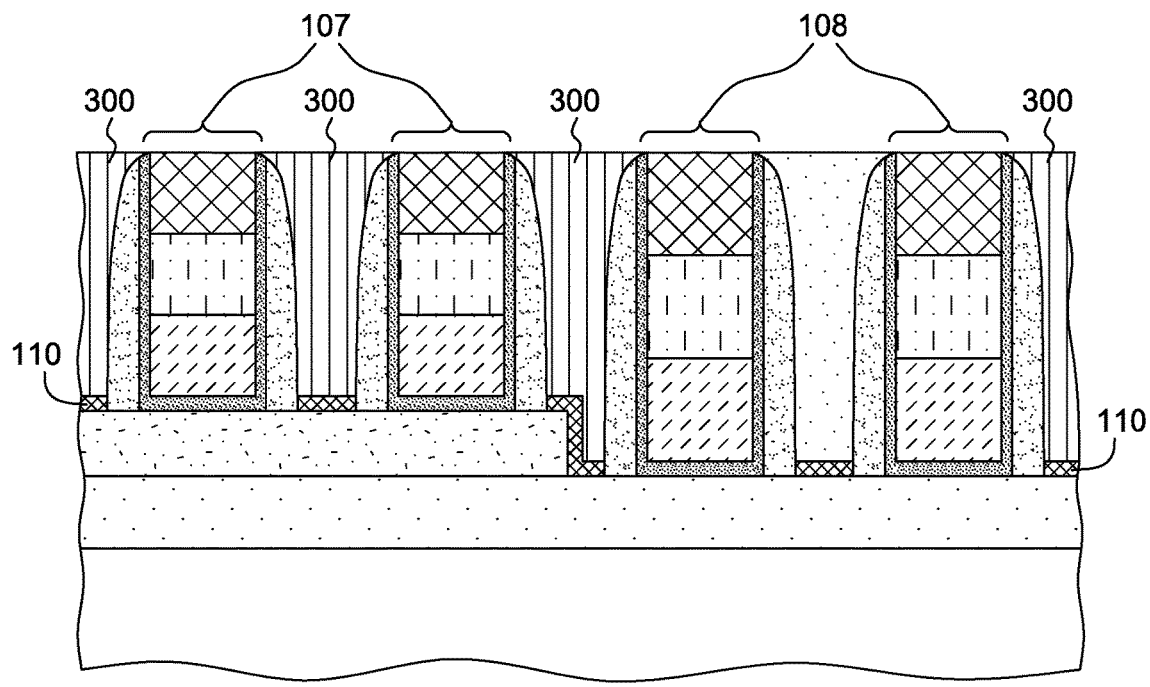
FIG. 3B depicts a cross-sectional view of a semiconductor with a deposit of oxide material, in an embodiment in accordance with the present invention.

FIG. 3B depicts a cross-sectional view of a semiconductor with a deposit of interlevel dielectric (ILD) material (e.g., oxide). Oxide 300 is deposited and polished so that it is formed in regions, not including resistor region 202, between gates 107 and gates on oxide 108. Oxide 300 is recessed on top of liner 110. ILD oxide deposited in resistor region 202 located between the outer sides of gate walls 200 of the gates on oxide 108 is removed after polish.

Figure 3C:
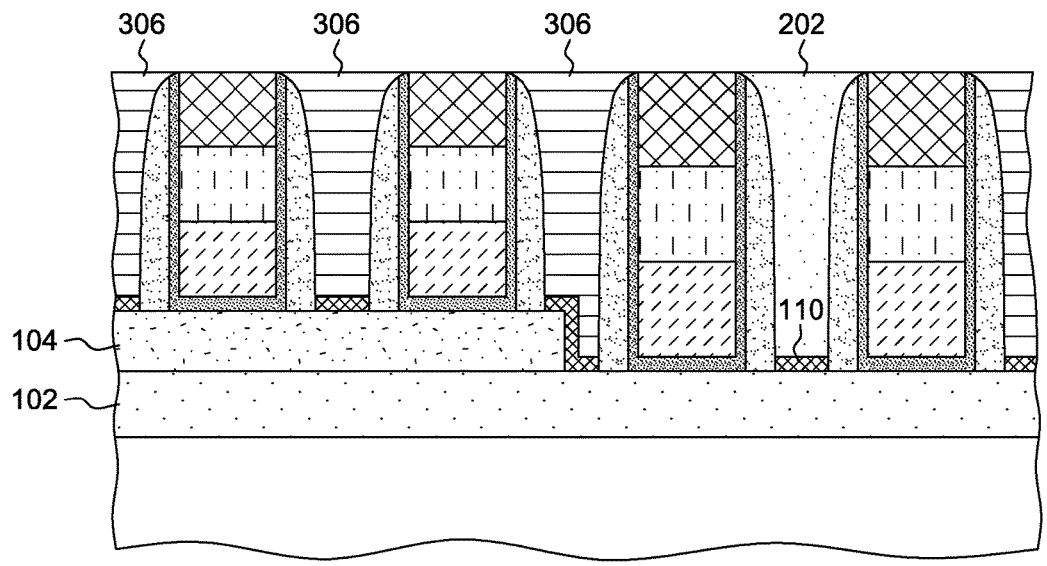
FIG. 3C depicts a cross-sectional view of a semiconductor with an active area and an insulator region, in an embodiment in accordance with the present invention.

FIG. 3C depicts a cross-sectional view of a semiconductor with an active area and an insulator region, in an embodiment in accordance with the present invention. Contact (CA) layer 306 represent the contacts to a source or drain for the active region of the semiconductor device. Contact formation can include, applying a contact mask in areas, etching oxide 300 and liner 110 (if present) in the contact openings, and filling the contact openings with conductors. For example, tungsten (W) with a conductor linear such as, titanium nitride (TiN).

Figure 3D:
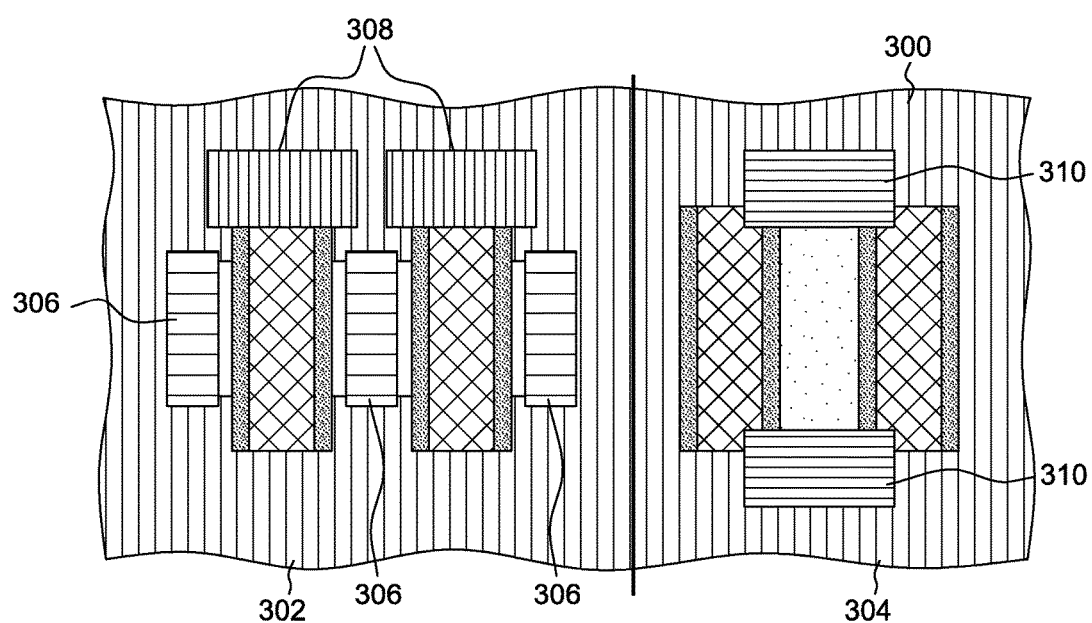
FIG. 3D depicts a top-down view of a semiconductor with an active area and an insulator area, in an embodiment in accordance with the present invention.

FIG. 3D depicts a top-down view of a semiconductor with an active area and an insulator area, in accordance with embodiments of the invention. Active portion 302 of the semiconductor device represents the active region with gates 107 and resistor portion 304 of the semiconductor device represents resistor region 202 between gates on oxide 108. A first interconnect layer is referred to as CA layer 306 and CA layer 310 that contact the source/drain regions, while a second local interconnect layer is referred to herein as CB layer 308 that contacts the gates and resistors. In this embodiment, multiple CA layer 306, CA layer 310, and CB layer 308 are implemented in the semiconductor device and other local interconnect layers (not shown in the figures) may also be implemented. Each CA layer 306 electrically connects to a source or drain of the active portion 302 and each CB layer 308 electrically connects to each gate 107. Each CA layer 310 electrically connects to the two ends of resistors region 202 between the two gates on oxide 108, where one CA layer 310 acts as a contact for a ground and the second CA layer 310 acts as a contact for an applied voltage.

Figure 4A:
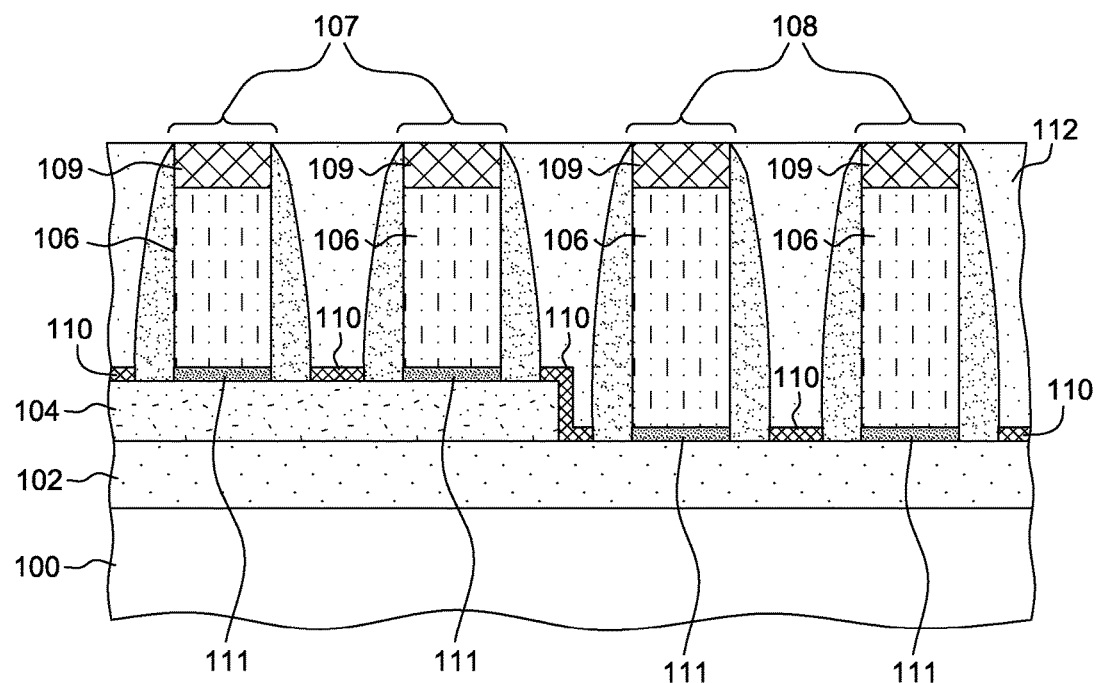
FIG. 4A depicts a cross-sectional view of a semiconductor with filling material having gone through a chemical mechanical polishing process, in an embodiment in accordance with the present invention.

FIG. 4A depicts a cross-sectional view of a semiconductor with filling material having gone through a chemical mechanical polishing process, in an embodiment in accordance with the present invention. In this embodiment, the semiconductor device with gates 107 and gates on oxide 108 are built on a silicon-on-insulator (SOI) substrate which includes semiconductor substrate 100 and buried oxide layer (BOX) 102. Each gate on oxide 108 represents a structure connected to the insulator region (e.g., BOX 102), without semiconductor layer 104 channeling through each gate on oxide. The two gates on oxide 108 will act as a base for a resistor while the two gates 107 will act as a base for a logic of the active semiconductor device. Each gate may include undoped amorphous and a dummy gate oxide 111. Each gate may further include hardmask 109 which can be any suitable dielectric (e.g., silicon nitride). Each gate may further include spacers on gate walls.

Liner 110 represents a dielectric layer deposited using, for example, chemical vapor deposition (CVD). In this embodiment, liner 110 is silicon nitride and lines the surface between each gate 107 and gate on oxide 108. In this embodiment, filling material 112 is deposited on liner 110 and is also undoped amorphous silicon. Since filling material 112 is undoped amorphous silicon, an oxide top surface can be utilized on filling material 112 to prevent the etching of filling material 112 during dummy gate removal.

Figure 4B:
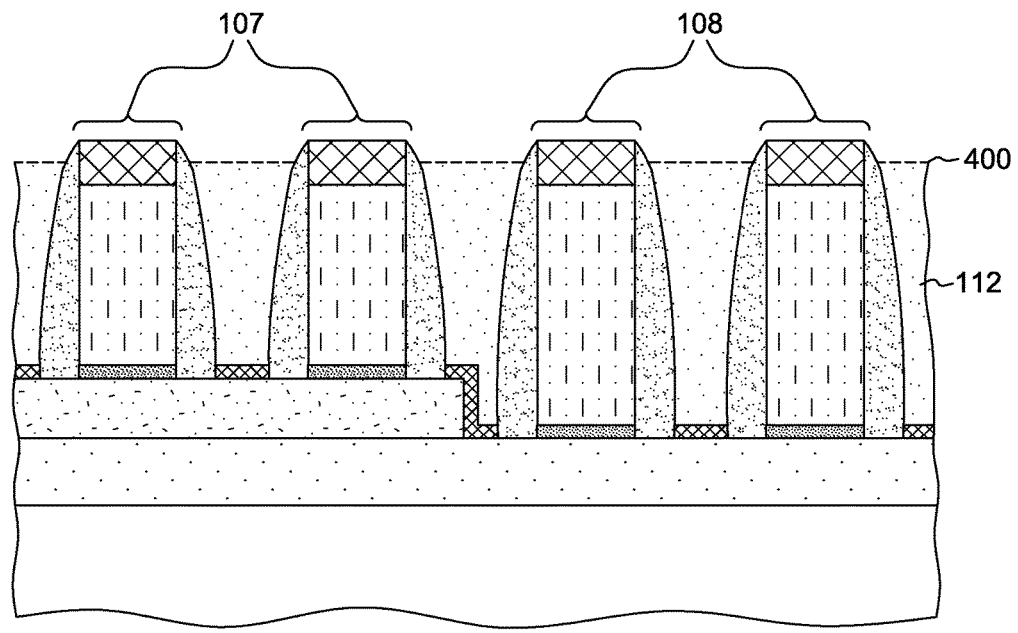
FIG. 4B depicts a cross-sectional view of a semiconductor with a partial etch of filling material, in an embodiment in accordance with the present invention.

FIG. 4B depicts a cross-sectional view of a semiconductor with a partial etch of filling material, in an illustrative embodiment in accordance with the present invention. Filling material 112 undergoes a partial etch (i.e., recess) of around 10 nm to level 400 on the semiconductor device. The partial etching can be a dry etch (e.g., RIE), or wet etch (e.g., hot phosphoric acid). Level 400 represents the top surface of the etched filling material 112 with respect to gates 107 and gates on oxide 108.

Figure 4C:
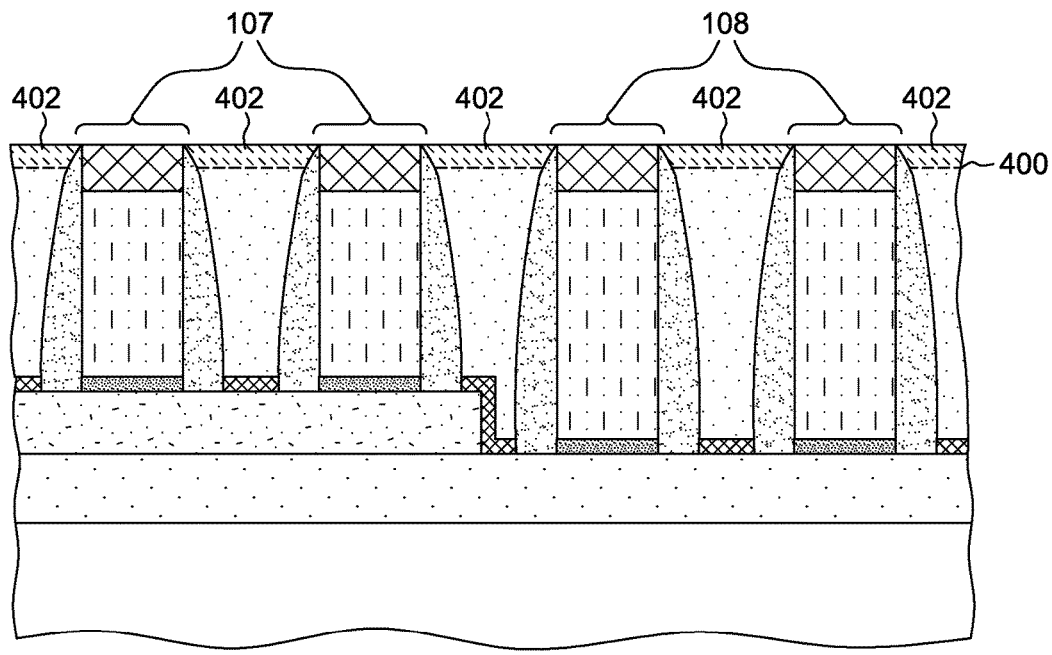
FIG. 4C depicts a cross-sectional view of a semiconductor device with a deposit and chemical mechanical polish of oxide material, in an embodiment in accordance with the present invention.

FIG. 4C depicts a cross-sectional view of a semiconductor device with a deposit and chemical mechanical polish of oxide material. Filler oxide 402 is deposited on top of filler material 112 at level 400 between gates 107 and gates on oxide 108, where filler oxide 402 can exceed the height of gates 107 and gates on oxide 108. Filling oxide 402 undergoes a CMP process down to the top surface of gates 107 and gates on oxide 108. The top surface of filling oxide 402 aligns with the top surface of hardmask 109 for each of gate 107 and gate on oxide 108.

Figure 4D:
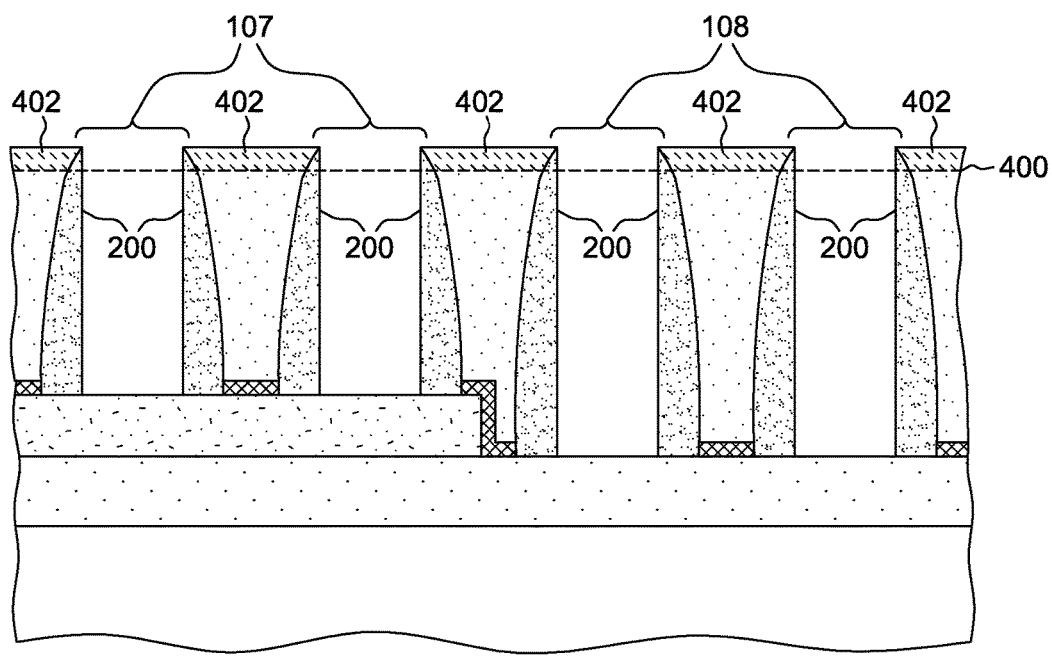
FIG. 4D depicts a cross-sectional view of a semiconductor with a removal of dummy gates, in an embodiment in accordance with the present invention.

FIG. 4D depicts a cross-sectional view of a semiconductor with a removal of dummy gates, in an embodiment in accordance with the present invention. Gate walls 200 of gates 107 and gates on oxide 108 represent the walls of the trench where undoped amorphous silicon 106 and hardmask 109 were pulled out. The hardmask 109 can be removed through etching, preferably by dry etch (e.g., RIE), or wet etch (e.g., hot phosphoric acid). Undoped amorphous silicon 106 can be removed by dry etch (e.g., RIE) or wet etch (e.g., TMAH or ammonia etch) and any dummy gate oxide removed by hydrofluoric acid or chemical oxide removal. Filling oxide 402 protects filling material 112, which is also undoped amorphous silicon, during the removal of undoped amorphous silicon 106 from gates 107 and gates on oxide 108.

Filling oxide 402 acts as a hardmask on top of filling material 112 and can be removed during pre-cleaning of high-K material prior to the deposition of gate dielectric 209 and materials, such as workfunction metal (WFM) 204, fill metal 206, and self-aligned contact (SAC) cap 208, into gates 107 and gates on oxide 108. In another embodiment, filling oxide 402 can remain on top of filling material 112 and acts as part of the resistor region 202. Utilizing undoped amorphous silicon as filling material 112 allows for the resistor region 202, located between the two gates on oxide 108, to be of higher resistance compared to utilizing a boron doped amorphous silicon as filling material 112, as previously discussed in FIGS. 1A through 3D. The creation of the resistor region 202 between gates on oxide 108 is completed utilizing the processes discussed in the descriptions of FIGS. 2B through 3D above.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Having described various embodiments of a semiconductor device including an inter-level dielectric layer (which are intended to be illustrative and not limiting), it is noted that modifications and variations may be made by persons skilled in the art in light of the above teachings. It is therefore to be understood that changes may be made in the particular embodiments disclosed which are within the scope of the invention as outlined by the appended claims.

What is claimed is:

1. A method of fabricating a semiconductor device, the method comprising: forming a first dummy gate in an active area on a first portion of a semiconductor device, wherein the first dummy gate includes undoped amorphous silicon;
   forming a second dummy gate and a third dummy gate on a second portion of the semiconductor device, wherein the second dummy gate and the third dummy gate include undoped amorphous silicon;
   depositing a filling material on the semiconductor device, wherein the filling material is doped amorphous silicon;
   performing a chemical-mechanical polishing process (CMP) on the filling material;
   removing a hard mask, a dummy gate oxide, and undoped amorphous silicon from each of the first dummy gate, the second dummy gate, and the third dummy gate;
   depositing a high-K dielectric on the semiconductor device;
   forming a first replacement gate, a second replacement gate, and a third replacement gate, wherein the first, the second, and the third replacement gate each include a work function metal, a fill metal, and a hard mask cap; and
   masking a portion of the filling material between the second replacement gate and the third replacement gate, wherein a mask covers the portion of the filling material for a resistor.

2. The method of claim 1, further comprising:
   removing the filling material, wherein the filling material does not include the portion of filling material between the second replacement gate and the third replacement gate; and
   removing the mask covering the portion of the filling material between the second replacement gate and the third replacement gate.

3. The method of claim 2, further comprising:
   depositing a dielectric material in areas where the filling material was removed; and
   performing a CMP on the dielectric material.

4. The method of claim 3, further comprising:
   prior to depositing filling material on the semiconductor device, depositing a liner on the semiconductor device.

5. A method of fabricating a semiconductor device, the method comprising:
   forming a first dummy gate in an active area on a first portion of a semiconductor device, wherein the first dummy gate includes undoped amorphous silicon;
   forming a second dummy gate and a third dummy gate on a second portion of the semiconductor device, wherein the second dummy gate and the third dummy gate include undoped amorphous silicon;
   depositing a filling material on the semiconductor device, wherein the filling material is amorphous silicon;
   etching a top surface of the filling material below a top surface of at least the first dummy gate, the second dummy gate, and the third dummy gate;
   depositing a cap material where the filling material was etched;
   removing a hard mask and the amorphous silicon from each of the first dummy gate, the second dummy gate, and the third dummy gate;
   removing the cap material from the top surface of the filling material;
   depositing a high-K dielectric on the semiconductor device;
   forming a first replacement gate, a second replacement gate, and a third replacement gate, wherein the first, the second, and the third replacement gates include a work function metal, a fill metal, and a hard mask cap; and
   masking a portion of the filling material between the second replacement gate and the third replacement gate, wherein a mask covers the portion of the filling material for a resistor.

6. The method of claim 5, further comprising:
prior to etching a top surface of the filling material, performing a CMP on the filling material.

7. The method of claim 5, further comprising performing a CMP on the cap material.

8. The method of claim 5, wherein the amorphous silicon of the filling material is undoped.

9. The method of claim 5, further comprising:
removing the filling material, wherein the filling material does not include the portion of filling material between the second replacement gate and the third replacement gate; and
removing the mask covering the portion of the filling material between the second replacement gate and the third replacement gate.

10. The method of claim 9, further comprising:
depositing an oxide material where the filling material was removed; and performing a CMP on the oxide material.

11. The method of claim 5, further comprising:
depositing a high-K dielectric on the semiconductor device; and
forming a first, a second, and a third replacement gate, wherein the first, the second, and the third replacement gates include a work function metal, a fill metal, and a hardmask cap.

12. The method of claim 10, further comprising:
prior to depositing filling material on the semiconductor device, depositing a liner on the semiconductor device.

13. A method of forming an integrated circuit (IC) structure having a resistor region, the method comprising:
providing a structure including a pair of dummy gates positioned on a substrate, wherein each of the pair of dummy gates include undoped amorphous silicon;
forming a filling material on the substrate and the pair of dummy gates, wherein the filling material includes doped amorphous silicon;
planarizing the filling material such that an upper surface of the filling material is substantially coplanar with an upper surface of each of the pair of dummy gates;
removing a hard mask, a dummy gate oxide, and the undoped amorphous silicon from each of the pair of dummy gates;
forming a pair of replacement gates on the substrate, wherein each of the pair of replacement gates includes a gate dielectric, a work function metal, a fill metal, and a hard mask cap; and
forming a mask on a portion of the filling material positioned between the pair of replacement gates, such that the portion of the filling material covered by the mask defines a resistor region.

14. The method of claim 13, further comprising:
removing a portion of the filling region not positioned between the pair of dummy gates and beneath the mask; and
removing the mask to expose the resistor region after removing the portion of the filling region not positioned between the pair of dummy gates and beneath the mask.

15. The method of claim 14, further comprising:
forming an interlevel dielectric (ILD) on the substrate; and
planarizing the ILD such that an upper surface of the ILD is substantially coplanar with an upper surface of the resistor region and an upper surface of each of the pair of replacement gates.

16. The method of claim 15, wherein the ILD is positioned laterally between one of the pair of replacement gates and another replacement gate positioned on the substrate.

17. The method of claim 13, wherein forming the gate dielectric of each of the pair of replacement gates includes depositing a high-K dielectric on the substrate.

18. The method of claim 13, wherein planarizing the filling material comprises performing a chemical mechanical polishing (CMP) process on the filling material.

19. The method of claim 13, further comprising:
depositing a liner on the substrate before forming the filling material on the substrate.

* * * * *